PHASE LOCKED LOOP WITH INCREASED PHASE LINEARITY

Filed Feb. 21, 1966 2 Sheets-Sheet 1

INVENTOR.
ANTHONY J. CASTELLANO, JR.
BY Kenyon & Kenyon
ATTORNEYS

PHASE LOCKED LOOP WITH INCREASED PHASE LINEARITY

Filed Feb. 21, 1966

INVENTOR.
ANTHONY J. CASTELLANO, JR.
BY Kenyon & Kenyon
ATTORNEY

United States Patent Office 3,286,188

Patented Nov. 15, 1966

3,286,188

PHASE LOCKED LOOP WITH INCREASED PHASE LINEARITY

Anthony J. Castellano, Jr., R.F.D. 3, Windmill Road, New Fairfield, Conn.

Filed Feb. 21, 1966, Ser. No. 528,901
5 Claims. (Cl. 329—122)

This application is a continuation-in-part of application Serial No. 286,085, filed on June 6, 1963 and entitled, "Phase Locked Loop With Increased Phase Linearity."

This invention relates in general to a phase locked loop and more particularly to a means for increasing the linearity of the phase characteristic of such a loop so that the output voltage can track with step changes of input frequency without overshooting and ringing.

The operation of a typical prior art phase locked loop is described in broad terms in my co-pending application, Serial No. 259,869, filed in the United States Patent Office on February 20, 1963, now Patent No. 3,249,893. A phase locked loop is typically used to demodulate an input information signal. The input to the phase locked loop is a frequency and the output from the phase locked loop is a voltage whose magnitude (and polarity) is a function of the deviation of the input frequency from band center frequency. When used as a demodulator, band center frequency is, of course, carrier frequency. The transfer function for the phase locked loop is fairly complex. That is, the relationship between the output voltage magnitude and the phase (or frequency) of the input signal is a complex function having a number of root solutions. As a consequence, the typical operable phase locked loop does not respond well to step input frequency changes. The typical loop is such that a step change in input frequency will be reproduced as a step change in output voltage with a large overshoot or ringing. Or, if the circuit is damped to eliminate overshoot, the response time is too great and a step change of input is not reproduced as a step change of output.

The transfer function itself has a phase angle which varies with frequency. The overshooting and ringing that occurs is substantially due to the fact that the phase angle of the transfer function varies in a non-linear fashion with frequency. It is a major purpose of this invention to provide a design for a phase locked loop so that the phase angle of the transfer function will vary linearly with the frequency of the input signal. In this application, the phase "linear phase transfer function" will mean an output voltage to input phase (or frequency) transfer function which has a phase angle that varies linearly with frequency.

In brief, this invention involves integrating the design of a phase locked loop with a low-pass output filter and an amplifier to provide an appropriate over-all transfer function. The low-pass filter and amplifier are designed so that their transfer function will combine with the transfer function of the phase locked loop to provide a net linear phase transfer function.

The transfer function (of output voltage to input phase) for the phase locked loop may be expressed as a complex fraction having a real linear numerator and a third power denominator. The numerator has a single real root while the denominator has one real root and two complex roots. Hereinafter, a numerator root will be termed a *zero* and a denominator root will be termed a *pole*. Thus the transfer function for the prior art loop has one real zero, one real pole and two complex poles.

To such a phase locked loop there is added, by this invention, a low-pass output filter having a transfer function (output voltage to input voltage) with four complex poles. Within limits, the low-pass output filter can be designed so that the four complex poles will be distributed in such a fashion that in conjunction with the two complex poles of the loop, a Gaussian response for the six complex poles may be obtained. By thus properly arranging the relative values of this set of six complex poles, the net effect of these poles on the overall transfer function can be made to provide a linear phase response.

There still remains the non-linear characteristics introduced by real zero and the real pole of the phase locked loop. In this invention, to counteract those influences, the ouput amplifier that is included is designed to have an output voltage to input voltage transfer function with a real pole than substantially equals to real zero of the loop and which amplifier also has a real zero that is substantially equal to the real pole of the loop. Thus the pole and zero of the amplifier substantially cancel out respectively the zero and pole of the loop. In this fashion, by cancelling out the real roots and by arranging the complex roots in a Gaussian set, this invention provides a demodulator having a substantially linear phase transfer function (relationship between input signal phase or frequency and output voltage).

It should be noted that the Gaussian set of complex roots are distributed on the complex plane in a curve that forms a segment of a particular set of ellipses. The roots are referred to herein as a Gaussian set because a band pass filter having a linear phase transfer characteristic when pulsed with a spike provides an output that has a bell-shaped aspect.

In briefest terms, the real poles and zeroes cancel while the complex poles combine to form a set of poles similar to those in a six pole linear phase low-pass filter. Thus the transient response of the combined phase locked loop, low-pass filter and output amplifier has the characteristics of a six pole linear phase low-pass filter.

One less satisfactory approach to the problem of ringing that has been attempted is to design the low-pass filter to have a cut-off point that is approximately ⅕ of the undamped natural frequency of the loop filter so that only the lower ⅕ of the band width available from the phase locked loop is used. Since the poles and zeros do not occur in the lower fifth of the band width (or, at least, the loop 11 can be readily designed so that no poles and zeros occur in the lower fifth of the band width) there results a linear phase characteristic. The great disadvantage of designing the low-pass filter in this fashion is that a large portion of the band width is lost. It is a major purpose of this invention to achieve linearity without losing band width.

A second unsatisfactory approach to solving the problems posed by the poles and zeros in the transfer characteristic is to design the undamped natural frequency and/or cut-off characteristics of the loop filter to be sufficiently high so that the poles and zeros can be pushed right out of the band width range within which the loop demodulator is to operate. There are two major disadvantages to this approach. First, a great deal more noise will be passed by the re-designed loop filter since the re-designed loop filter will have a much higher cut-off point. Thus the signal to noise ratio will be materially decreased. A second major disadvantage is that for the higher operating band center frequencies, the re-designed loop filter parts become so small as to make design stability difficult and to introduce variations in the operation of the loop due to stray capacitances.

The modified phase locked loop demodulator of this invention is used to provide pulse amplitude modulated data. The information carried by the demodulator output is determined by the height of the output pulse. Thus it is important that the output pulse be a square pulse with a relatively flat top so that an accurate pulse level reading can be made. The requirement for a square pulse output means that rise time must be minimized. The requirement for a flat top means that oversoot must be minimized.

Accordingly, it is a broad object of this invention to provide a phase locked loop demodulator which has a transfer function having a linear phase characteristic.

It is a further related object of this invention to provide such a linear phase transfer characteristic without significantly increasing the time delay of the loop's response to step changes of input frequency.

From a practical point of view, it is a purpose of this invention to provide a means for avoiding the ringing that occurs when a step change in input frequency is applied to a phase locked loop demodulator.

It is a more specific object of this invention to provide a loop demodulator which will convert frequency modulated information into pulse amplitude modulated information, the pulses being square, flat-topped pulses.

Other objects and purposes of this invention will become apparent from a consideration of the following detailed description and of the drawings, in which.

Figure 1:
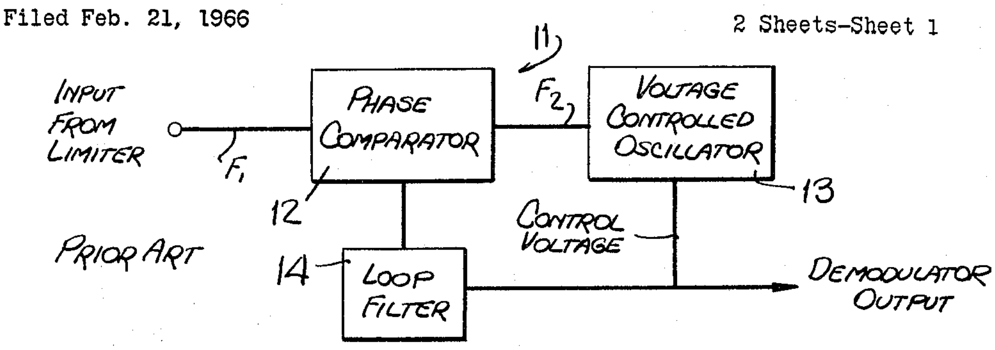
FIG. 1 is a block diagram of the prior art phase locked loop demodulator.

FIG. 1 illustrates a prior art phase locked loop 11, the operation of which is described in detail in my copending application referenced above. This prior art phase locked loop 11 is composed of a phase comparator 12, a voltage controlled oscillator 13 (hereinafter VCO) and a loop filter 14. The phase comparator 12 has two inputs, one being the input signal $F_1$ and the other the VCO 13 output $F_2$. The phase comparator 12 compares these two inputs and provides an output signal which has a "D.C." value that is a linear function of the phase difference between the two comparator 12 input frequencies. The phase comparator 12 output is then fed through a loop filter 14 to the input of the VCO 13 to control the frequency value of the VCO 13 output $F_2$. In this fashion the VCO 13 output $F_2$ tracks with the frequency of the input signal $F_1$ to the phase comparator 12 but maintains a phase difference with the input signal $F_1$ so as to provide an appropriate phase comparator 12 output; appropriate, that is, to keep the VCO13 at the proper frequency $F_2$.

The loop filter 14 can be ignored for purposes of a general description of the way in which this phase locked loop 11 operates. However, the loop filter 14 is required in order to maintain appropriate dynamic characteristics for the phase locked loop 11. And, it is because the loop filter 14 is necessary that the problems to which this invention is addressed arise.

Figures 3, 5:
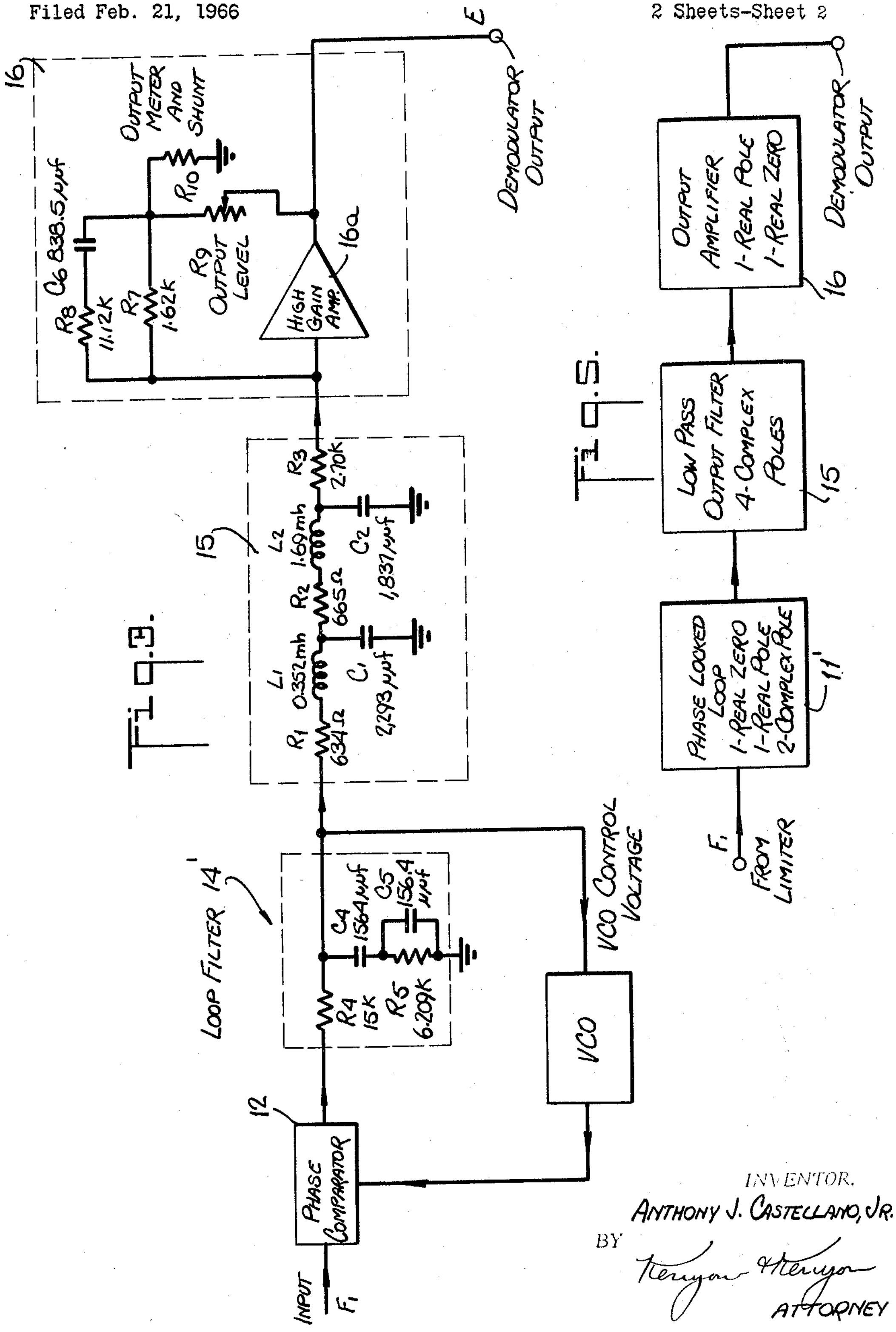
FIG. 3 is a block and schematic diagram showing the actual schematic arrangement and magnitudes of the parts of the pertinent blocks in FIG. 2 in a typical embodiment.
FIG. 5 is a simplified block diagram of the FIG. 2 demodulator.

FIG. 3 shows the structure of a loop filter, the loop filter consisting of two resistors $R_4$, $R_5$ and two capacitors $C_4$, $C_5$. The phase comparator 12 will provide a duty cycle modulated square wave output which is converted to a duty cycle modulated triangular wave by the loop filter 14. The loop filter 14 operates to provide a complicated transfer function for the entire phase locked loop 11. Although it is true that the phase comparator 12 and VCO 13 do contribute to the transfer function of the entire phase locked loop 11, it is the loop filter 14 that shoulders the blame for the problems that arise.

As is shown in FIGS. 3 and 5, this invention involves the combination of a low-pass filter 15 having four complex poles and an amplifier 16 having one real pole and one real zero with a phase locked loop 11' having one real zero, one real pole and two complex poles. These various poles and zeros are designed in relation to one another so as to provide an over-all net linear phase transfer function.

The phase locked loop 11' and in particular the loop filter 14' employed in the demodulator of this invention is designated with numerals having a prime to distinguish them from the FIG. 1 prior art phase locked loop 11 and loop filter 14. The distinction is in the magnitude of the various parts employed since optimum design of the FM demodulator of this invention involves designing the loop 11' and in particular the loop filter 14' so as to achieve values for the two complex poles which will form an appropriate Gaussian set with the four poles designed into the low-pass output filter 15. The point here is that in the optimum design of the FM demodulator of this invention, one does not simply take a given prior art phase locked loop 11 and attach onto it an appropriate low-pass output filter 15 and appropriate output amplifier 16 without redesigning the phase locked loop itself so that the poles and zeros in the entire FM demodulator have the appropriate relationship to one another.

A low-pass output filter is typically used with the prior art phase locked loop demodulator 11 in order to eliminate, from the output voltage $E_0$, the triangular wave component of the duty cycle modulated loop filter 14 output. Normally, the low-pass filter employed in prior art designs contained either three or five poles. In either case, one of the poles was a real pole and the others were complex poles. However, in no case were the complex poles designed in conjunction with the design of the two complex poles in the phase locked loop to provide a total six pole Gaussian set.

As has been discussed previously, it is desirable to make the cut-off frequency of the low-pass filter 15 at least equal to the $F_1$ band width so as to be able to use the full capability of the band. It is also desirable to keep the upper cut-off frequency as close down to a magnitude equal to the $F_1$ band width as possible so as to cut out as much noise as possible without losing band width capability.

For the loop filter 14' schematic structure shown in FIG. 3, the loop filter 14' transfer function can be shown to be:

$$A=\frac{K_1P+1}{K_2P^2+K_3P+1}$$

where:

A is the transfer function
P represents $j\omega$
$K_1=R_5C_4(1+a)$
$K_2=aR_4R_5C_4^2$
$K_3=R_4C_4+R_5C_4+aR_5C_4$ in all of which:

$$a=C_5/C_4;\ O<a\leqslant 1$$

The above transfer function, as well as all the transfer functions discussed herein, are expressed in the frequency domain rather than the time domain for ease of mathematical manipulation.

This transfer function can then be fed into the fairly simple transfer function of the entire phase locked loop 11'. The loop 11' transfer function can be expressed as:

$$\frac{E_0}{\phi_1}=\frac{AN}{1+A(GN/P)}\text{ or }\frac{E_0}{\omega_1}=\frac{AN}{P+AGN}$$

in which:

$E_0$=output voltage=$AK(\phi_1-\phi_0)$
$\phi_1$=phase of $F_1$
$N$=phase comparator 12 constant in volts/radian
$G$=VCO 13 sensitivity in radians/sec./volt
$A$=the loop filter transfer function When the loop filter 14' transfer function has been fed into the over-all loop 11' transfer function the result can be expressed as:

$$\frac{E_0}{\phi_1}=\frac{K_1NP+NG}{K_2P^3+K_3P^2+(1+K_1NG)P+NG}$$

The resulting transfer function for the entire phase locked loop 11', accordingly, has a real linear numerator and a three power denominator. The numerator has a single real zero and the denominator has one real pole and two complex poles. It is appropriate to say that the transfer function for the entire phase locked loop 11 has one real zero, one real pole and two complex poles. The various solutions to this loop 11' transfer function are such that a step change of input frequency $F_1$ will be reproduced as a step change in output voltage $E_0$ which will have a large overshoot or ringing.

The transfer function for the low-pass output filter 15 employed in connection with this invention has four complex poles; the general form of the function being:

$$\frac{E\text{ out}}{E\text{ in}}=\frac{R_3}{K_4P^4+K_5P^3+K_6P^2+K_7P+K_8}$$

in which:

$$K_4=L_1C_1L_2C_2R_3$$
$$K_5=L_2C_2C_1R_1R_3+L_1C_1C_2R_2R_3+L_1C_1L_2$$
$$K_6=C_1C_2R_1R_2R_3+C_1R_1L_2+L_1C_1R_3+L_1C_1R_2+L_1C_2R_3+L_2C_2R_3$$
$$K_7=C_1R_1R_3+C_1R_1R_2+C_2R_1R_3+C_2R_2R_3+L_1+L_2$$
$$K_8=R_1+R_2+R_3$$

Within limits, this low-pass output filter 15 can be designed so that the four complex poles will be distributed in such a fashion that in conjunction with the two complex poles of the loop 11', a Gaussian set for the six complex poles may be obtained. By thus properly arranging the values of this set of six complex poles, the net effect of these poles on the over-all transfer function may be made to provide a linear phase response.

There still remains the non-linear characteristics introduced by the real zero and the real pole of the loop 11'. In this invention, to counteract those influences, an output amplifier 16 is included which is designed to have a real pole that substantially equals the real zero of the loop 11' and which amplifier 16 also has a real zero that is substantially equal to the real pole of the loop 11'. Thus the pole and zero of the amplifier 16 substantially cancel out respectively the zero and pole of the loop 11'. In this fashion, by canceling out the real roots and by arranging the complex roots in Gaussian set, this invention provides a substantially linear phase transfer function (relationship between input signal phase or frequency and output voltage).

The transfer function (voltage gain) of the output amplifier 16 shown has one real zero and one real pole; the form of the transfer function being:

$$\frac{E\text{ out}}{E\text{ in}}=-\left[\frac{R_7}{R_a}\times\frac{1+R_8C_6P}{1+(R_7+R_8)C_6P}\left(1+\frac{R_9}{R_{10}}\right)+\frac{R_9}{R_a}\right]$$

wherein $R_a=R_1+R_2+R_3$

The composite transfer characteristic for the FM demodulator of this invention will have three sets of complex poles, which, when positioned properly on the complex plane, will yield a six pole low-pass Gaussian responsive. The appropriate design may be made by one skilled in this art by use of the Weinberg Tables. These tables are found in: "Network Design by Use of Modern Synthesis Techniques and Tables," Louis Weinberg; Hughes Technical Memorandum No. 427, April 1956.

Figure 4:
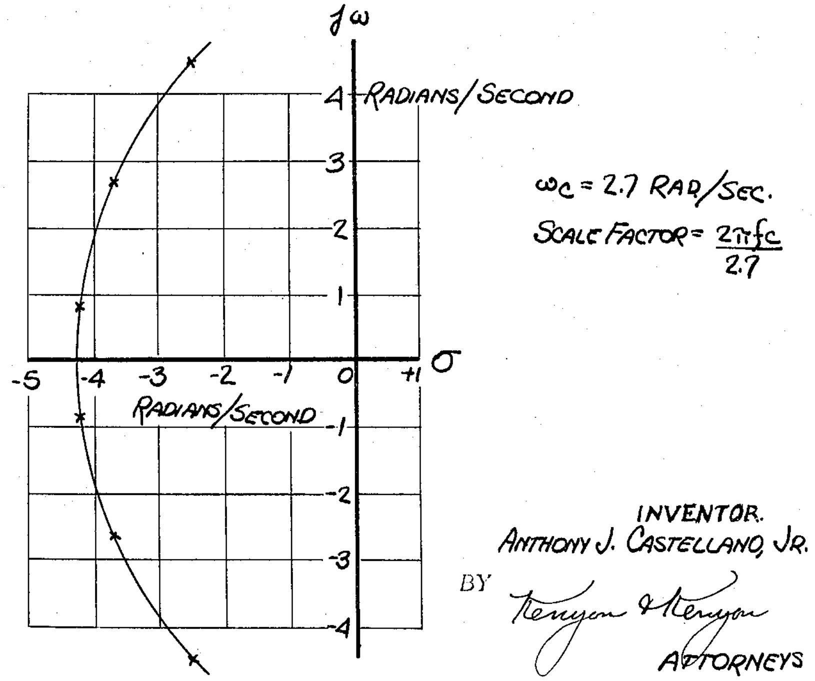
FIG. 4 is a plot on the complex plane of the six complex poles in the embodiment shown in FIG. 3.

The normalized plot of the six complex poles obtained in the particular embodiment illustrated in FIG. 3 is shown in FIG. 4. It is known that the curve connecting the six poles shown is an ellipse segment. It might be noted that not all pole distributions which fall on any ellipse segment will provide a linear phase or "Gaussian" transfer characteristic. However, the particularly relationship required between the poles may be determined from the Weinberg Tables.

The four complex poles of the filter are selected so that in conjunction with the two complex poles of the phase locked loop a six pole arrangement is provided that has the same pole arrangement as is employed when designing a filter of the Gaussian family. In the preferred embodiment of this invention, the six poles will have a location on the complex plane that are listed in the Weinberg Tables for Maximally Flat Time Delay Filters. These six poles are thus the roots of a sixth order Bessel polynomial. The particular set of pole locations dictated by the "maximally flat delay" table in the Weinberg Tables is preferred but is only one of the three sets of pole locations that are generally known as the Gaussian family. The other two are termed "Gaussian response." In any case, the point here is that a linear phase output voltage to input phase transfer function can be obtained for a demodulator that incorporates a phase locked loop by a design which selects the complex poles in a fashion similar to that for an ordinary filter of the Gaussian family in conjunction with means for cancelling out the real poles and roots of the phase locked loop.

The set of complex poles which are so distributed as to provide the linear transfer characteristic are referred to herein, and particularly in the claims, as a Gaussian set to indicate their relationship to the set of complex poles that would be selected in designing any one of the filters of the Gaussian family.

It should be noted that one significant difference between the approach of this invention and the other two approaches outlined earlier is that in this invention the poles of the over-all transfer function occur within the band width range. These poles are not pushed out of the band width and thus do not require a design which produces either excessive noise or which constricts band width available.

The linear phase transfer characteristic provided by this invention permits a design which will satisfactorily cause the voltage output $E_0$ to track with a step change in frequency input $F_1$ with the shortest delay time possible and with minimum overshoot. As a practical matter, to design for absolutely no overshoot would mean too great a delay in rise time and thus it is generally desirable to design for a small amount of overshoot, generally not more than 2% overshoot.

Figure 2:
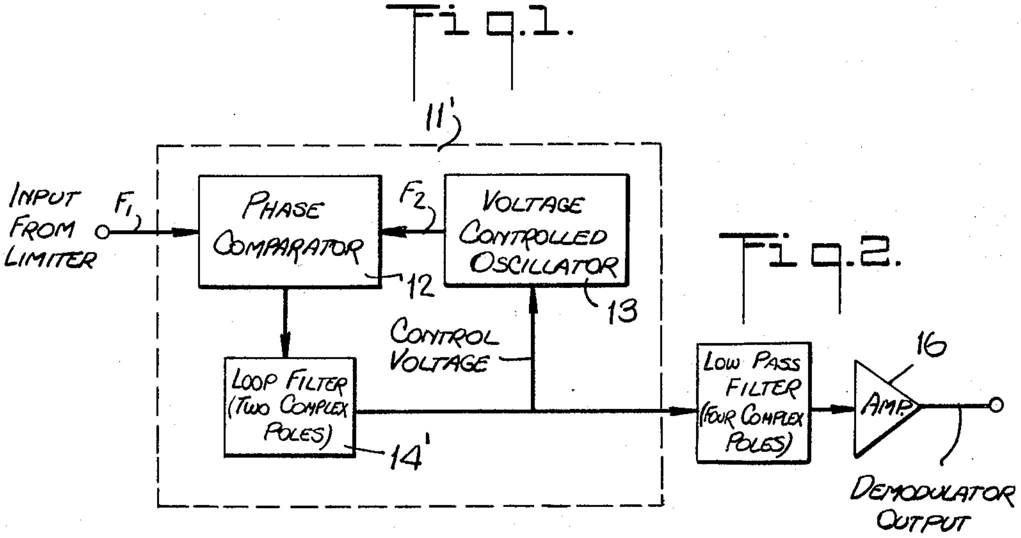
FIG. 2 is a block diagram of a demodulator of this invention.

Although, FIG. 2 shows the invention in block form as the addition of the appropriate low-pass filter 15 and amplifier 16 to a phase locked loop shown in FIG. 1, it is FIG. 5 which best illustrates the basic invention. In FIG. 5, a phase locked loop 11' is shown as a single block having one real zero, one real pole and two complex poles. This invention resides in recognizing that a particularly design low-pass output filter 15 having four complex poles and a properly designed output amplifier having one real pole and one real zero can be designed in conjunction with the design of the phase locked loop 11' in order to achieve the linear phase transfer characteristic desired.

In general terms, this invention recognizes that a phase locked loop with a transfer function having any number of poles, be they real or complex, may be modified by the addition of appropriate filters and amplifiers to eliminate the net effect of the real poles and zeros and to provide a set of complex poles which are distributed on the complex plane so as to provide Gaussian response. To obtain this Gaussian response, an even number of complex poles must appear in the final design of the modified phase locked loop.

It should be recognized that the Gaussian set of poles may include one real pole in addition to the even number of complex poles (it being possible for one pole to lie on the real axis in the complex plane). There is no particular need or advantage to incorporating a real pole and thus the additional circuitry illustrated is not designed to include the real pole that could be included. In the FIG. 3 embodiment illustrated, the real pole in phase locked loop 11' is canceled because it would be too limiting on the design of the phase locked loop 11' to insist that that particular real pole form part of a Gaussian set with the complex poles in the phase locked loop 11. Thus the real pole in the phase locked loop 11' is canceled by a real zero in the output amplifier 16 not because it is impossible to have one (and no more than one) real pole in the final design but because the real pole that could be included would have to form part of the Gaussian set of poles. Accordingly, it is to be understood that the attached claims are not limited so as to exclude one uncanceled real pole in the demodulator.

In the embodiment illustrated, the design of the phase locked loop 11' was a given factor with two complex poles. Accordingly, the output filter added could have been designed to have any number of even complex poles. However, the output filter 15 illustrated was selected to have four complex poles in order to effect an appropriate comprise between simplicity of design and the filtering of noise in the output. From the point of view of suppression of noise in the output $E_0$, as large a number of poles in the filter 15 as is possible is desirable. But, additional poles in the filter 15 will increase the size of the filter and require additional components. In addition, a large number of poles inthe filter 15 will increase the order of the equation that has to be solved and will therefore make it increasingly difficult to select the right magnitudes for these poles in order to provide the Gaussian distribution required. Thus, the filter 15, with four complex poles, is preferable as a comprise between complexity and noise suppression.

What is claimed is:

1. An FM demodulator comprising:
   - a phase locked loop having an output voltage to input phase transfer function with *n* real zeros, *n* real poles and *p* complex poles,
   - a low-pass filter connected in series with said phase locked loop, the output voltage to input voltage transfer function of said filter having *q* complex poles, wherein $p+q$ is an even number no less than four, and
   - an amplifier in series with said filter and said phase locked loop, the output voltage to input voltage transfer function of said amplifier having *n* real poles and *n* real zeros,
   - each of said *n* real poles in said amplifier substantially equaling in magnitude a separate one of said *n* real zeros in said phase locked loop, and each of said *n* real zeros in said amplifier substantially equaling a separate one of said *n* real poles in said phase locked loop,
   - said *q* complex poles in said filter and said *p* complex poles in said loop forming a set of $p+q$ complex poles distributed on the complex plane as a Gaussian set,
   - whereby a substantially linear phase transfer function is provided for said demodulator.

2. The demodulator of claim 1 wherein said phase locked loop has two complex poles and said low-pass filter has four complex poles.

3. The demodulator of claim 1 wherein said phase locked loop has one real zero, one real pole and two complex poles; said low-pass filter has four complex poles; and said amplifier has one real pole and one real zero, said real pole of said amplifier being substantially equal in magnitude to said real zero of said loop and said real zero of said amplifier being substantially equal in magnitude to said real pole of said loop.

4. The demodulator of claim 1 wherein said Gaussian set of $p+q$ complex poles are the roots of a $(p+q)$th order Bessel polynomial.

5. An FM demodulator comprising:
   - a phase comparator having a first input and a second input to provide a duty cycle modulated square wave output, the extent of the duty cycle modulation being a function of the phase difference between whatever two signals are fed to said first and said second inputs,
   - a voltage controlled oscillator having an input and an output, the output of said oscillator being connected to one of said inputs of said phase comparator,
   - a loop filter connected between the output of said phase comparator and the input of said voltage controlled oscillator to provide the desired dynamic response,
   - said comparator, said oscillator and said loop filter constituting a phase locked loop, the output voltage to input phase transfer function of the said phase locked loop having one real zero, one real pole and two complex poles,
   - a low-pass output filter connected to the output of said loop filter, the output voltage to input voltage transfer function of said low-pass output filter having four complex poles, and
   - an amplifier connected to the output of said low-pass filter, the output voltage to input voltage transfer function of said amplifier having one real pole and one real zero,
   - the two complex poles of said phase locked loop and the four complex poles of said low-pass output filter constituting a set of six poles distributed on the complex plane as the roots of a sixth order Bessel polynomial, and
   - said real zero of said phase locked loop and said real pole of said amplifier being substantially equal to one another in magnitude,
   - said real pole of said phase locked loop and said real zero of said amplifier being substantially equal to one another in magnitude.

References Cited by the Examiner

UNITED STATES PATENTS

| | | | |
|---|---|---|---|
| 3,012,200 | 12/1961 | Hurvitz | 328—134 |
| 3,080,533 | 3/1963 | Edwards | 329—111 X |
| 3,100,871 | 8/1963 | Richardson et al. | 329—122 X |
| 3,101,448 | 8/1963 | Costas | 329—50 |
| 3,142,806 | 7/1964 | Fernandez | 329—122 X |
| 3,204,185 | 8/1965 | Robinson | 329—122 X |

OTHER REFERENCES

Angelo, Electronic Circuits, McGraw-Hill, N.Y., 1958, TK7870A58, p. 350 relied on.

HERMAN KARL SAALBACH, *Primary Examiner.*

P. L. GENSLER, *Assistant Examiner.*